(12) United States Patent
Shenoi (10) Patent No.: US 6,549,604 B2
(45) Date of Patent: Apr. 15, 2003

(54) CLOCK RECOVERY AND DETECTION OF RAPID PHASE TRANSIENTS

(75) Inventor: Kishan Shenoi, Saratoga, CA (US)

(73) Assignee: Symmetricom, Inc., San Jose, CA (US)

( * ) Notice: Subject to any disclaimer, the term of this patent is extended or adjusted under 35 U.S.C. 154(b) by 199 days.

(21) Appl. No.: 09/749,249

(22) Filed: Dec. 26, 2000

(65) Prior Publication Data

US 2002/0001356 A1 Jan. 3, 2002

Related U.S. Application Data

(63) Continuation-in-part of application No. 60/173,232, filed on Dec. 28, 1999.

(51) Int. Cl.[7] .......................... H03K 21/00; H03K 23/00
(52) U.S. Cl. ...................................... 377/39; 340/146.2
(58) Field of Search .............................. 377/39, 48, 49; 340/146.2

(56) References Cited

U.S. PATENT DOCUMENTS

| | | | | |
|---|---|---|---|---|
| 4,870,665 A | * | 9/1989 | Vaughn | 327/114 |
| 5,095,264 A | * | 3/1992 | Hulsing, II | 324/76.47 |
| 5,355,396 A | * | 10/1994 | Tai | 377/26 |
| 5,508,679 A | * | 4/1996 | McClure | 340/146.2 |
| 5,625,652 A | | 4/1997 | Petranovich | 375/355 |
| 5,696,462 A | * | 12/1997 | Maturi et al. | 327/151 |
| 5,790,614 A | | 8/1998 | Powell | 375/376 |
| 5,982,833 A | | 11/1999 | Waters | 375/372 |

FOREIGN PATENT DOCUMENTS

EP          0312671          4/1989

OTHER PUBLICATIONS

Adachi et al., "PLL Frequency Synthesizer for TDMA Systems," *IEEE International Conf. On Universal Personal Communications*, 4:I, IIA, IIB; 1995.

* cited by examiner

*Primary Examiner*—Tuan T. Lam
(74) *Attorney, Agent, or Firm*—Gray Cary Ware & Freidenrich, LLP (57) ABSTRACT

Systems and methods are described for clock recovery and detection of rapid phase transients. An apparatus includes: a numerically controlled oscillator; a phase detector coupled to the numerically controlled oscillator; and a multiplexer coupled to the phase detector and the numerically controlled oscillator, wherein a) the phase detector sets a state variable indicator to either i) a high value if an output phase of the numerically controlled oscillator lags an incoming signal phase, or ii) a low value if the output phase leads the incoming signal phase, b) the multiplexer sends either i) a high increment to the numerically controlled oscillator if the state variable indicator has been set to the high value, or ii) a low increment to the numerically controlled oscillator if the state variable indicator has been set to the low value, and c) the numerically controlled oscillator either i) advances the output phase if the high increment has been sent to the numerically controlled oscillator, or ii) retards the output phase if the low increment has been sent to the numerically controlled oscillator. A method includes incrementing a high counter once every clock cycle if a state variable indicator is high; clearing a low counter if the state variable indicator is high; incrementing the low counter once every clock cycle if the state variable indicator is low; clearing the high counter if the state variable indicator is low; and triggering an alarm signal if either i) the low counter exceeds a low count threshold or ii) the high counter exceeds a high count threshold.

16 Claims, 6 Drawing Sheets

FIG. 1

PRIOR ART

Fig. 2.

PRIOR ART

PRIOR ART

CLOCK RECOVERY AND DETECTION OF RAPID PHASE TRANSIENTS

CROSS-REFERENCE TO RELATED APPLICATION

This application is a continuation-in-part of, and claims a benefit of priority under 35 U.S.C. 119(e) and/or 35 U.S.C. 120 from, copending U.S. Ser. No. 60/173,232, filed Dec. 28, 1999.

BACKGROUND OF THE INVENTION

1. Field of the Invention

The invention relates generally to the field of signal processing. More particularly, the invention relates to clock recovery and detection of rapid phase transients.

2. Discussion of the Related Art

Clock recovery is a fundamental procedure in all digital receivers. For instance, in T1 transmission schemes the serial data is transported as a series of (bipolar) pulses wherein the presence of a pulse indicates a digital "1" and absence of a pulse indicates a digital "0." It is essential that the receiver have an accurate estimate of the duration, separation and position of the pulse (or absence) to decide the nature of the transmitted bit. This, in essence, is the notion of a clock recovery. As one consequence, the receiver makes available a signal that has the same timebase (notion of time interval) as the transmitter.

In synchronization equipment, such as the Symmetricom DCD Series, clock recovery is used to establish a reference timebase. An oscillator locked to this reference is said to be traceable to the transmitter. For specificity, the reference input is assumed to be a DS1 (or T1) signal. This signal is characterized by a (nominal) bit rate of 1.544 Mbps, that is, an underlying clock frequency of (nominally) 1.544 MHz.

Recovering the clock from an incoming T1 signal involves some reprocessing circuitry which provides an intermediate signal from which the clock is recovered. In particular, analog circuitry provides the functions of AGC (automatic gain control) and "slicing". Slicing involves setting a threshold for deciding whether the signal voltage is close to zero, which translates to a "digital/0", or large, corresponding to a "digital 1". That is, the preprocessing circuitry generates a digital signal (i.e. two level) with a pulse for each instantiation of a pulse in the incoming T1 signal. Subsequent digital circuitry then uses this signal to generate a (roughly) square wave which is representative of the recovered clock signal.

One technique for deriving the recovered clock signal is described below. This method is used in several Symmetricom products.

Figure 1:
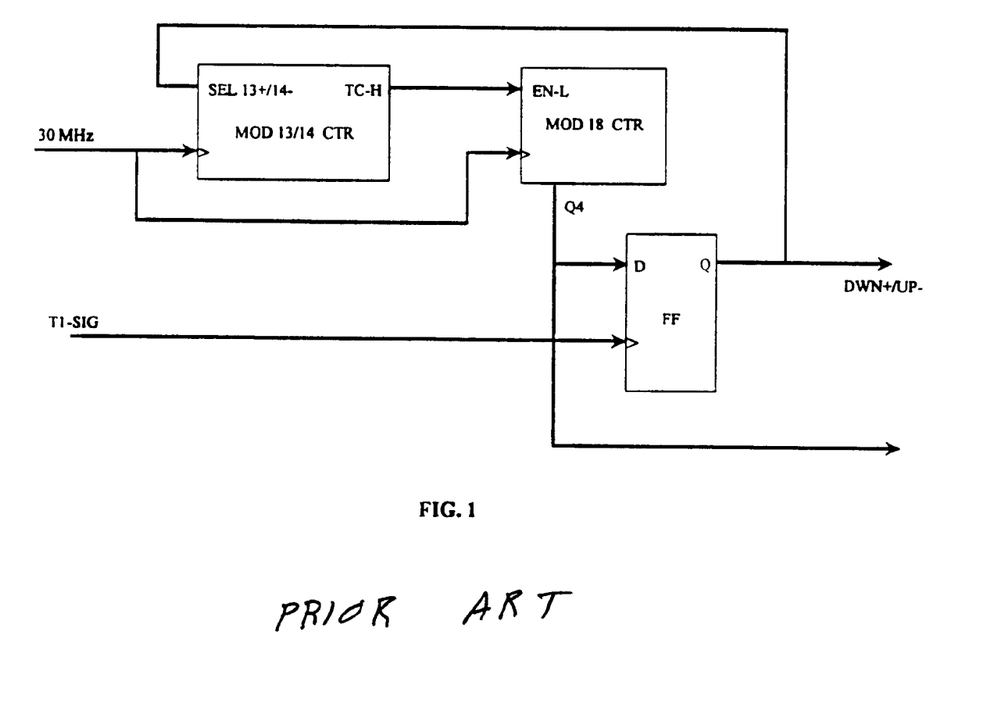
FIG. 1 illustrates a conventional method of clock recovery from a T1 signal based on dividers, appropriately labeled "PRIOR ART."

Referring to FIG. 1, a preprocessed T1 signal, namely the pulse train obtained using analog circuitry, is called "T1-SIG". A stable clock signal of (nominally) 30 MHz is provided to run the circuitry shown (the dividers shown are appropriate for a 30 MHz digital reference clock; for other choices of reference clock frequency the dividers would have to be modified appropriately). The circuit includes a 13/14 counter (MOD 13/14 CTR). That is, a counter that operates as either a modulo-13 counter or a modulo-14 counter according to the control signal shown (SEL 13+/14−). The signal labeled "TC-H" is high for one clock period every 13 (or 14, depending on which modulo mode is selected) clock periods. The circuit also includes a modulo-18 counter (MOD 18 CTR) with a "clock-enable" control.

The modulo-18 counter operates normally when the control signal "EN-L" is LOW but does not count when "EN-L" is HIGH. The modulo-18 counter (implemented as a binary counter) requires 5 bits of which Q4 is the most significant. The waveform associated with Q4 will be nominally square (50% duty cycle) and the mechanism shown forces Q4 to have a frequency nominally equal to the underlying clock frequency of the T1 signal.

The combination of the two counters ensures that the frequency of the Q4 waveform is, very roughly, 1.544 MHz. When the mod-13/14 counter is selected to run in the modulo-13 mode, every 13 clock cycles the modulo-18 counter "skips" one count. Consequently, the frequency associated with the signal Q4 is (30/18)·(12/13) MHz, which is 1.538461 . . . MHz. When the modulo-14 mode is selected, the frequency associated with Q4 is (30/18)·(13/14) MHz which is 1.547619 . . . MHz. By switching back and forth between these two modes, the average frequency of Q4 can be made equal to the underlying frequency of the incoming T1 signal.

This action is depicted in FIG. 1. If the rising edge of a pulse in T1-SIG occurs prior to the rising edge of Q4, then the flip-flop ("FF") output will be LOW which causes the counter scheme to go into the modulo-14 mode, effectively using the higher frequency which, in turn, tends to make the rising edges of Q4 to occur earlier. If the rising edge of T1-SIG occurs after the rising edge of Q4, the modulo-13 or lower frequency mode will be selected causing the rising edge of Q4 to be aligned to the instants where T1-SIG has rising edges. The associated timing diagram is depicted in FIG. 2.

The output of FF (flip-flop) indicates whether recovered clock is faster or slower than the implied T1 clock. The FF output is "held" when T1-SIG has "missing" pulse. The time-average of the FF output is a measure of frequency difference between T1 and 30 MHz reference.

Figure 2:
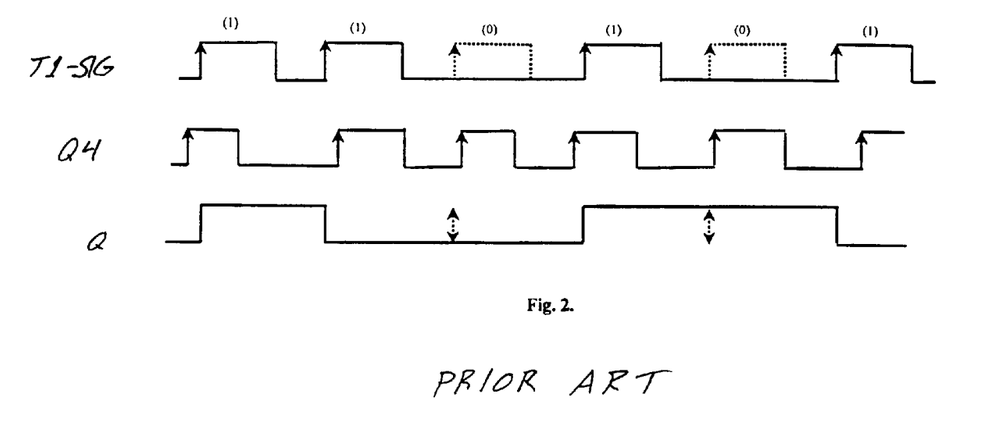
FIG. 2 illustrates a conventional timing diagram explaining operation of the clock recovery feedback mechanism associated with the method depicted in FIG. 1, appropriately labeled "PRIOR ART."

FIG. 2 is not drawn to scale. However, FIG. 2 illustrates the key points of the clock recovery scheme. The top trace denotes T1-SIG. Note that when the T1 signal has a data bit of "0", the corresponding occurrence in T1-SIG is a "missing pulse". The second trace indicates the waveform of Q4 and the bottom trace the waveform associated with the control signal that chooses the modulo-13/modulo-14 operation. The time average (measured over a significant number of clock cycles) of the FF output is indicative of the frequency of the T1 signal relative to the local reference (30 MHz, nominal, in the above example). In particular, let $p_{13}$ be the fraction of time that the signal FF is HIGH. Then $p_{14}=(1-p_{13})$ is the fraction of time the signal FF is LOW. Clearly, $p_{13}$ is the fraction of time that the modulo-13 divider is operative and $p_{14}$ is the fraction of time the modulo-14 counter is active. The overall action of the circuit is to "lock" the frequency of Q4 to the underlying T1 frequency. Thus the following equation can be postulated:

$$F_{T1} \cong f_{Q4} \cong f_R \cdot \left[ p_{13} \cdot \frac{12}{13} \cdot \frac{1}{18} + p_{14} \cdot \frac{13}{14} \cdot \frac{1}{18} \right]$$

Where $f_{T1}$, $f_{Q4}$ and $f_R$ are the frequencies of the T1 signal, the recovered clock signal, and the local reference clock signal, respectively.

When the T1 signal has a data bit of "0", there is a missing pulse in T1-SIG. The action of the circuit is to "hold" the previous control value for the mod-13/mod-14 counter. Thus if there is a long string of "0"s in the T1 signal then there will be significant periods of time where the frequency of Q4 is high (1.547619 . . . MHz) or low (1.538461 . . . MHz). The absence of any pulse in T1-SIG during this period implies that the circuit cannot correct for this apparent malfunction. However, in the applications of Symmetricom Synchronization products, the T1 signal is supposed to be a "framed-all-1s" signal and the preponderance of data bits are "1." Data bits of "0" occur only via the framing pattern and thus the worst-case scenario is one "0" in 193 bits.

SUMMARY OF THE INVENTION

There is a need for the following embodiments. Of course, the invention is not limited to these embodiments.

One embodiment of the invention is based on a method, comprising: incrementing a high counter once every clock cycle if a state variable indicator is high; clearing a low counter if the state variable indicator is high; incrementing the low counter once every clock cycle if the state variable indicator is low; clearing the high counter if the state variable indicator is low; and triggering an alarm signal if either i) the low counter exceeds a low count threshold or ii) the high counter exceeds a high count threshold. Another embodiment of the invention is based on an apparatus, comprising: a source of a clock signal; a source of a state variable indicator coupled to the source of the clock signal; a high counter coupled to the source of the clock signal and the source of a state variable indicator, the high counter incremented once every clock cycle if the state variable indicator is high; a low counter coupled to the source of the clock signal and the source of a state variable indicator, the low counter incremented once every clock cycle if the state variable indicator is low; and an alarm coupled to the high counter and the low counter, the alarm triggered if either i) the low counter exceeds a low count threshold or ii) the high counter exceeds a high count threshold, wherein the high counter is cleared if the state variable indicator is low, and the low counter is cleared if the state variable indicator is high.

Another embodiment of the invention is based on a method, comprising: setting a state variable indicator to either i) a high value if an output phase of a numerically controlled oscillator lags an incoming signal phase, or ii) a low value if the output phase leads the incoming signal phase; then sending either i) a high increment to the numerically controlled oscillator if the state variable indicator has been set to the high value, or ii) a low increment to the numerically controlled oscillator if the state variable indicator has been set to the low value; and then either i) advancing the output phase if the high increment has been sent to the numerically controlled oscillator, or ii) retarding the output phase if the low increment has been sent to the numerically controlled oscillator. Another embodiment of the invention is based on an apparatus, comprising: a numerically controlled oscillator; a phase detector coupled to the numerically controlled oscillator; and a multiplexer coupled to the phase detector and the numerically controlled oscillator, wherein a) the phase detector sets a state variable indicator to either i) a high value if an output phase of the numerically controlled oscillator lags an incoming signal phase, or ii) a low value if the output phase leads the incoming signal phase, b) the multiplexer sends either i) a high increment to the numerically controlled oscillator if the state variable indicator has been set to the high value, or ii) a low increment to the numerically controlled oscillator if the state variable indicator has been set to the low value, and c) the numerically controlled oscillator either i) advances the output phase if the high increment has been sent to the numerically controlled oscillator, or ii) retards the output phase if the low increment has been sent to the numerically controlled oscillator.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein like reference numerals designate the same elements. The invention may be better understood by reference to one or more of these drawings in combination with the description presented herein. It should be noted that the features illustrated in the drawings are not necessarily drawn to scale.

DESCRIPTION OF PREFERRED EMBODIMENTS

The invention and the various features and advantageous details thereof are explained more fully with reference to the nonlimiting embodiments that are illustrated in the accompanying drawings and detailed in the following description. Descriptions of well known components and processing techniques are omitted so as not to unnecessarily obscure the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this detailed description.

The entire contents of U.S. Ser. No. 60/173,232, filed Dec. 28, 1999, are hereby incorporated by reference for all purposes as if set forth herein in their entirety.

The clock recovery scheme can be extended with additional circuitry to ascertain whether the following two events occur. First is the notion of "excess zeros". Second is the notion of a rapid phase change in the incoming T1 reference signal.

If T1-SIG had no missing pulses then there would be (very approximately) one rising edge in every 18 clock cycles of the reference local clock signal (30 MHz). A simple counter arrangement, where a counter is clocked by the local oscillator and reset by (any) every rising edge of T1-SIG would never show a count much larger than 18 if the T1 signal was "all-1s". A count of about 36 could be observed if the T1 signal has one isolated "0". A count of about 750 would indicate the presence of a string of about 40 "0"s in the T1 signal. Thus, by setting a suitable threshold it can be ascertained if there has been a long string of "0"s in the T1 signal. This mechanism has been used quite widely in Symmetricom designs.

The technique depicted in FIGS. 1–2 can be extended to detect a rapid change in the phase/frequency of the incoming signal. This provides an important function in synchronization equipment. This extension was developed to handle the "unipulse" problem and a brief exposition of this problem is also provided.

Detection of a Rapid Change in the Incoming T1 Signal

In all synchronization equipment, the clock recovered from the incoming T1 signal is then used to discipline a stable oscillator using a narrow-band phase/frequency lock technique (PLL is an acronym for Phase Locked Loop; FLL stands for Frequency Locked Loop). The timing output signal provided by the equipment is derived from the disciplined oscillator.

The (final) output signal follows the input reference, albeit sluggishly. A phase step in the input signal will be reflected in a phase change (over time) of roughly the same magnitude. This behavior is expected and the equipment is not considered to have malfunctioned and in fact if the phase change of the output is less than the phase step introduced in the input signal then the equipment is considered to be well-behaved.

Now consider the case where the input signal has a rapid phase change of almost +180 degrees. This is a phase jump corresponding to one-half of a clock cycle or 0.5 UI (UI stands for Unit Interval and is equivalent to one bit-period in time or 360 degrees in phase). The output will try to follow this phase step and, after some time, will have moved (almost) +180 degrees. Now suppose the input signal phase reverted back to its original phase state via the introduction of a phase step of (almost) −180 degrees. The equipment output is expected to return to its original phase state. This expectation is problematic because an instantaneous phase step of +180 degrees is indistinguishable from an instantaneous phase step of −180 degrees. At times the equipment output phase change may thus be a net 360 degrees. This is the "unipulse" problem, the nomenclature stemming from the fact that the output seems to have moved 1 UI even though the (net) change in the input was 0 UI.

To protect against this so-called malfunction, it is necessary to monitor the input signal for a rapid change in phase state. This is achieved by the method described here. This method can be implemented as an extension of the clock recovery scheme described above.

To see how this method works, first note the following observations related to the clock recovery method. For convenience we will assume that the incoming T1 signal was "all-1s" and thus T1-SIG has no missing pulses (this assumption can be relaxed later).

The signal Q4 is a mixture of two different frequencies which can be called $f_{13}$ and $f_{14}$ which are nominally 1.538461 . . . MHz and 1.547619 . . . MHz, respectively. The feedback arrangement causes the alternation between the two which are present for $p_{13}$ and $p_{14}$ fractional time, respectively. The feedback is such that $$f_{T1} \approx f_{13} p_{13} + f_{14} p_{14}$$

The fractional quantities $p_{13}$ and $p_{14}$ are roughly constant regardless of the time interval over which they are observed providing, of course, that the input frequency is constant. That is, the FF output, which controls the selection of the modulo-13 or modulo-14 operation, is quite oscillatory in nature and long strings of HIGH or LOW will not be present.

If there is a slow variation in phase of the input signal then the fractional quantities will change to allow Q4 to "maintain phase tracking" of T1-SIG, but the oscillatory nature will be retained.

If the nominal frequency of T1-SIG is constant but, for some reason or another, one period is shortened by +x UI (x is a small fraction) then the mechanism will choose the higher frequency (modulo-14 selection) in a sustained manner till Q4 "catches up" with T1-SIG. Similarly, if one period of T1-SIG is lengthened by +y UI (again, y is a small fraction) then the mechanism will choose the lower frequency (modulo-13 selection) in a sustained manner till Q4 realigns with T1-SIG.

A rapid change in phase of the incoming T1 signal is, roughly, equivalent to the shortening or lengthening of one period of T1-SIG. In actuality, a few consecutive periods will be shortened/lengthened to get the overall shift corresponding to the phase change introduced.

To see how many UI elapse for the mechanism to realign the phase of Q4 and T1-SIG, note that the "high" and "low" frequencies (in fractional units) are +2.343943E-3 and −3.587086E-3 relative to the (nominal) T1 clock frequency of 1.544 MHz. If the incoming signal has a precession of x UI, then the "high" frequency must be selected for 426.6x UI (approximately), in a sustained manner, for the phase of Q4 to realign ("catch up") with T1-SIG. If the incoming signal has a delay of +y UI then the "low" frequency must be selected for 278.8y UI (approximately), in a sustained manner, for phase realignment. The last point provides the basis for the method for detecting a rapid change in phase.

Figure 3:
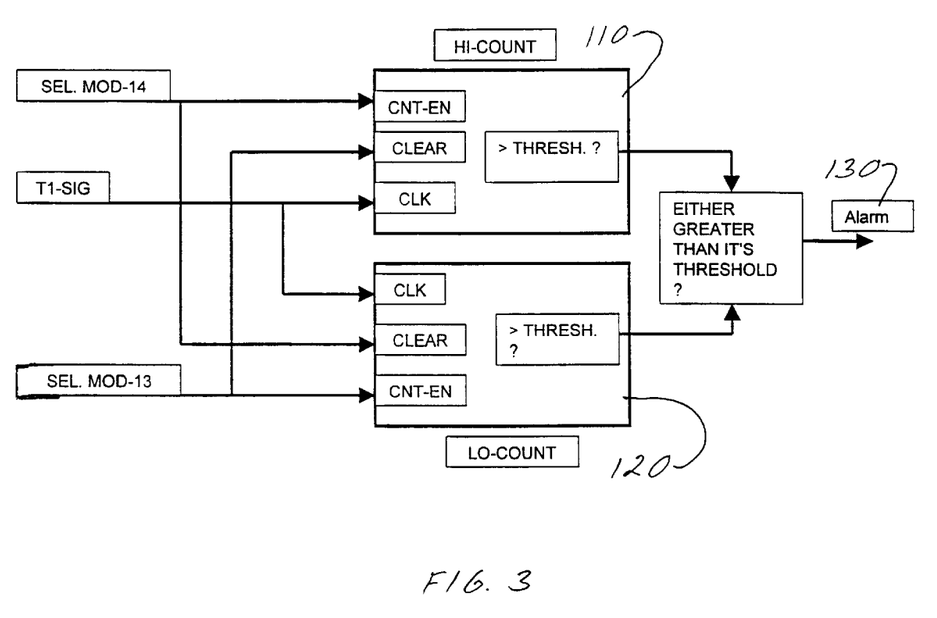
FIG. 3 illustrates a flowchart view of a scheme for detecting a rapid change in phase, representing an embodiment of the invention.

Referring to FIG. 3, two counters, clocked by T1-SIG (or a clock derived from either T1-SIG or Q4), are maintained. A first counter 110, HI-COUNT, counts (up) when modulo-14 is selected and a second counter 120, LO-COUNT counts (up) when modulo-13 is selected. HI-COUNT is reset when modulo-13 is selected and LO-COUNT is reset when modulo-14 is selected. Thus HI-COUNT is reflective of the number of UI that have elapsed since the last time modulo-13 was selected and LO-COUNT reflects the number of UI since modulo-14 was selected. If either of these counts exceeds a predetermined threshold then it can be stated that the input T1 signal included a rapid phase change. A suitable threshold would correspond to about 0.25 UI (use the value 0.25 for x and y).

Comparing FIG. 3 to FIG. 1, it can be appreciated that in FIG. 1 there is one signal labeled DWN+/UP− which controls the selection of the modulo-13 or modulo-14 operation. When DWN+/UP− is HIGH, the modulo-13 operation is selected. This corresponds to the signal shown in FIG. 3 as SEL.MOD-13 being "TRUE" or HIGH. When DWN+/

UP− is LOW the modulo-14 operation is selected, corresponding to the signal SEL.MOD-14 of FIG. 3 being TRUE or HIGH. When either the LO-COUNT or HI-COUNT counter value exceeds its threshold, a signal Alarm 130 is true, indicative of a rapid phase change detection event.

This rapid-phase-change-event detection can be used to supplement the PLL/FLL arrangement used to discipline the local oscillator such that the oscillator does not "follow" the recovered clock during transition phases. Techniques for implementing such a "don't-follow-during-transients" scheme have been implemented in several Symmetricom products and are not described here.

Using T1-SIG as the clock for the counters is advantageous since if there is a missing pulse then the counters do not change reflective of the fact that no decision is made when a pulse is missing.

T1 Clock Recovery Employing an NCO Technique

NCO is an acronym for numerically controlled oscillator. Essentially, as the name would imply, an NCO is a device that generates a frequency, derived from a (hopefully stable) local oscillator, that can be programmed via a numerical value in a (control) register.

Figure 4:
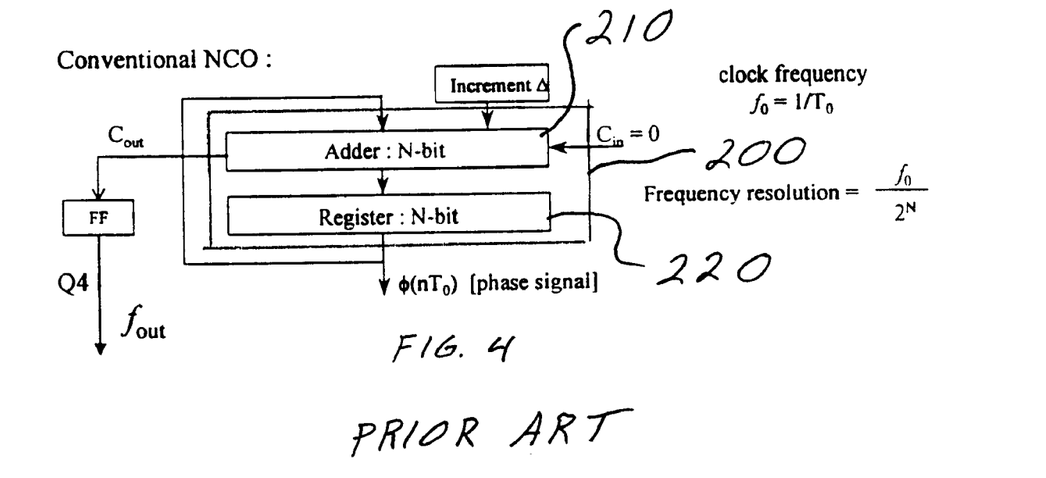
FIG. 4 illustrates a conventional structure of a numerically controlled oscillator, appropriately labeled "PRIOR ART."

A "conventional NCO" is depicted in FIG. 4. It comprises an accumulator 200 which is the combination of an adder 210 and a register 220. The local oscillator has a frequency $f_0$ and is used to load the results of the addition into the accumulator-register. The "increment" is what controls the frequency of the output signal. In a simple implementation, the carry-out ($C_{out}$ from the adder is loaded by $f_0$ into a flip-flop (one-bit register). The flip-flop output will be a pulsed waveform with a pulse repetition rate of $f_{out}$. The frequency of this output is related to the clock frequency, $f_0$, by the simple equation $$f_{out} \cong f_0 \frac{\Delta}{2^N}$$

In this equation the quantity N represents the wordlength of the accumulator (the register/adder size) and $\Delta$ is the numerical value of the increment and is an integer (often called an unsigned binary number). Typical values of N are between 16 and 48. The larger the value of N, the more precision can be achieved for the synthesized frequency. The above equation holds when the "carry-in" signal to the accumulator is always "0". The effective value of $\Delta$ can be augmented by forcing the carry-in to alternate between 0 and 1. If the carry-in is 1 for x% of the time, then the impact is similar to increasing $\Delta$ (an integer) by (x/100) (a fractional part). For convenience, it is assumed that the carry-in is held at 0.

Figure 5:
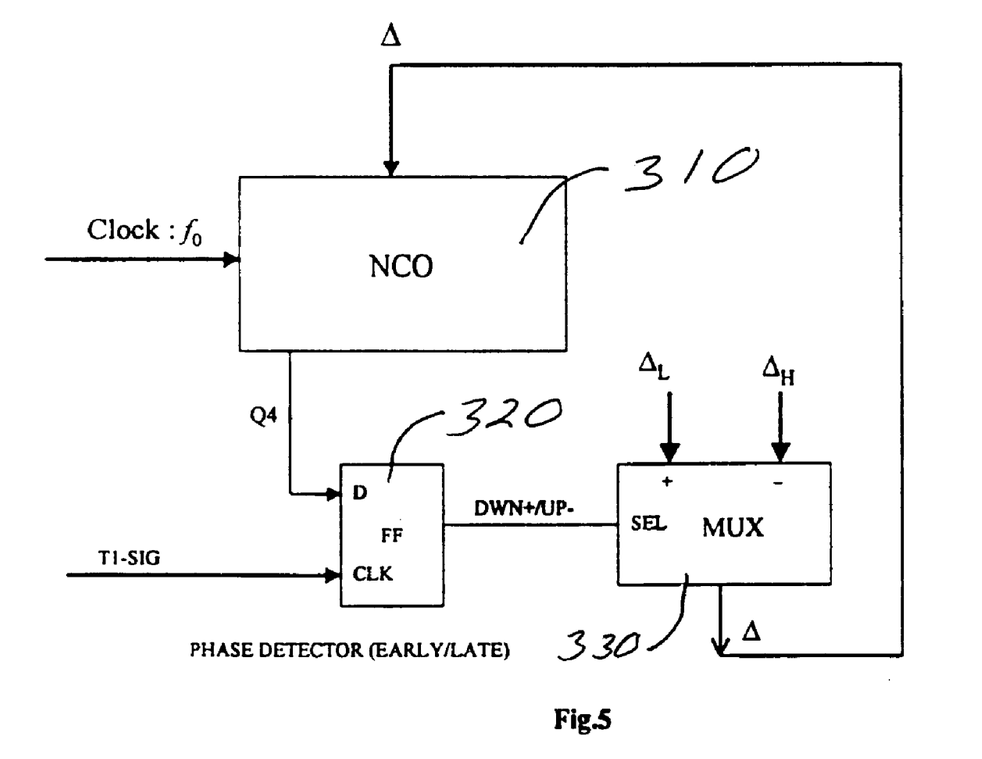
FIG. 5 illustrates a structure of a numerically controlled oscillator adapted for clock recovery, representing an embodiment of the invention.

Referring now to FIG. 5, the NCO form can be used quite advantageously to perform the function of clock recovery. To see how, recognize that the prior art achieves clock recovery by alternating between two frequencies. Likewise, the NCO form can be controlled by having two choices for increment, $\Delta$. Consider two values for $\Delta$, say $\Delta_H$ and $\Delta_L$, which satisfy the relationship.

$$f_0 \frac{\Delta_L}{2^N} < f_{T1} < f_0 \frac{\Delta_H}{2^N} \text{ or } f_L < f_{T1} < f_H$$

Then an NCO 310 can be controlled in much the same way as the divider scheme in the clock recovery method (prior art) described before. To emphasize the relationship, the output signal is labeled as Q4.

As a first implementation, the conventional NCO 310 can be modified by making the choice of increment, $\Delta$, based on the relative phase of the rising edge of Q4 and T1-SIG in much the same manner as the conventional method. This is illustrated in FIG. 5.

The output of the flip-flop 320 clocked by T1-SIG will be HIGH if the rising edge of Q4 occurs before the rising edge of T1-SIG and will be LOW if the rising edge of Q4 occurs after the rising edge of T1-SIG. This explains the nomenclature that the flip-flop 320, FF, performs the action of a phase detector in terms of an early/late decision. A multiplexer 330 sends either $\Delta_H$ or $\Delta_L$ to the NCO 310.

Considering the similarity between the conventional scheme and the NCO form, the question arises as to which is superior, if at all. The NCO form is superior for the following reasons:

Note that the conventional method requires the selection of three divider modulo quantities, A, N, and M, which depend on the choice of the local oscillator frequency, $f_0$, and the T1 frequency (1.544 MHz). In the scenario described, the local oscillator is (nominally) 30 MHz and the choices are A=18, N=13, and M=-14. It is not uncommon to specify M=(N+1). With this choice, the "high" frequency is +2344 ppm and the "low" frequency is −3587 ppm (relative to the T1 frequency). These are not symmetric about 0 and are quite large. It turns out that there is not much leeway in the choice of the dividers and these large variations are not easily avoided. The drawback of these large variations is the intrinsic jitter in the recovered clock signal. This large jitter is exacerbated if the T1 signal has an appreciable number of missing pulses (i.e. data bits="0").

The NCO form, on the other hand, provides much more leeway in the selection of $\Delta_L$ and $\Delta_H$ that can be tailored to the quality of the local oscillator. Consider the case when the local oscillator is nominally 30 MHz and has an intrinsic accuracy of 100 ppm. The T1 clock recovery specification requires a clock recovery even when the T1 signal is off-frequency by as much as 50 ppm. Clearly, if the high and low frequencies are of the order of ±200 ppm then there is adequate margin to recover the clock frequency and yet have an intrinsic jitter of much less than if the high and low frequencies were ±2300 ppm. For example, if the NCO wordlength is 16 bits, then one could choose $\Delta_H$=3374 and $\Delta_L$=3372 and obtain a "high" frequency which is +320.4 ppm and a "low" frequency which is −272.6 ppm. Clearly with a longer wordlength one could obtain frequencies that are more symmetric about the nominal. Nevertheless, even with such a short wordlength (16 bits) the jitter performance of the NCO form will still be clearly superior to the conventional method described.

The frequency of the incoming T1 signal relative to the local oscillator can be expressed in terms of the percentage of time each of the two frequencies are selected. Denote by $p_L$ the fraction of time the lower frequency, $f_L$, is selected and by $p_H$ the fraction of time the higher frequency, $f_H$ is selected. Then clearly $p_L=(1-p_H)$ and $$f_{T1} \cong P_L f_L + P_H f_H$$

or $$f_{T1} \cong f_0 \left( P_L \frac{\Delta_L}{2^N} + P_H \frac{\Delta_H}{2^N} \right)$$

Thus, as in the case of the conventional clock recovery method, the fraction of time the "low" frequency (or "high"

frequency) is selected is a measure of the relative frequency difference between the local oscillator and the incoming T1 signal timebase. Because using the NCO form allows one to keep the "high" and "low" frequencies much closer to the nominal, it is clear that the reliability and quality of the estimate of frequency difference is much better than in the conventional case (prior art).

The addition of a mechanism to detect rapid phase changes to the NCO form of clock recovery is quite straightforward. In fact, the same scheme depicted in FIG. 3 is applicable. By replacing the signal named "SEL.MOD-14" with "SEL-$\Delta_H$" and "SEL. MOD-13" with "SEL-$\Delta_L$", the requisite detection mechanism is obtained. That is, the DWN+/UP− signal of FIG. 5 is used as was the signal DWN+/UP− signal of FIG. 1. However, the calculation of thresholds would be based on 320.4 ppm vs. 2344 ppm and −272.6 ppm vs. −3587 ppm because the high and low frequencies are now closer to the nominal value.

Extension of the NCO Technique for Clock Recovery

The example of the NCO form described above used a wordlength of 16 bits for the accumulator and $\Delta_H$=3374 and $\Delta_L$=3372 to obtain a "high" frequency which is +320.4 ppm and a "low" frequency which is −272.6 ppm. Now suppose a wordlength of 18 bits and $\Delta_H$=13496 and $\Delta_L$=13488. One would obtain a "high" frequency which is +320.4 ppm and a "low" frequency which is −272.6 ppm (the same as before). If one modified $\Delta_L$ to 13487 then the "low" frequency would be −347 ppm providing a somewhat more symmetrical operation. Clearly, the larger the wordlength, the greater is the freedom of choice to obtain "high" and "low" frequencies that are reasonably symmetric about the nominal.

Figure 6:
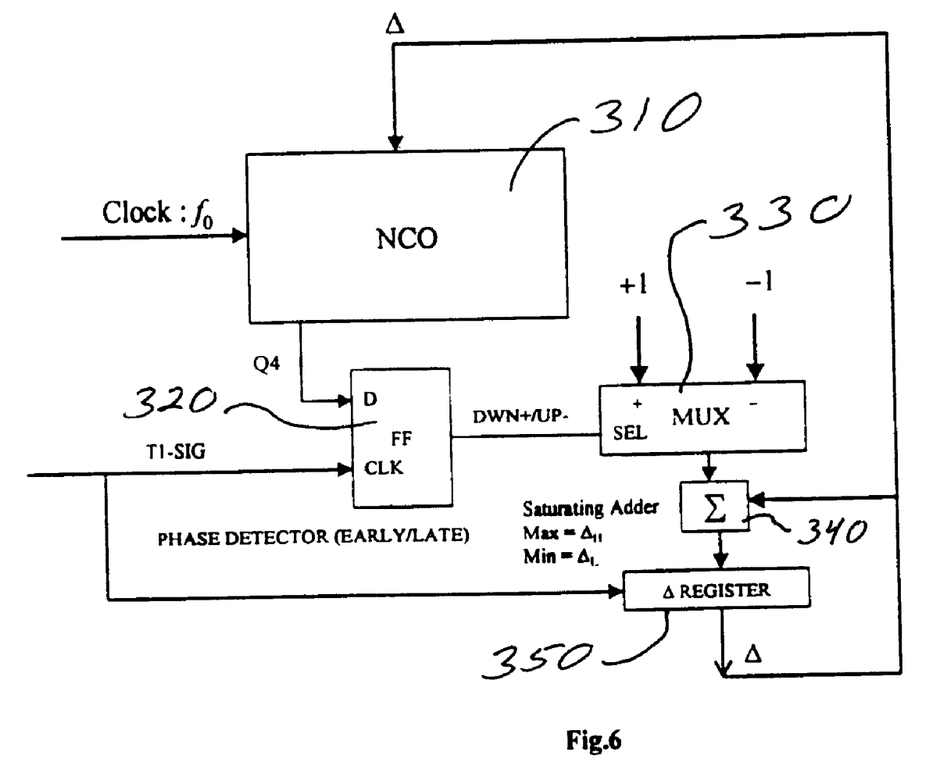
FIG. 6 illustrates a structure of a numerically controlled oscillator adapted and extended for enhanced clock recovery, representing an embodiment of the invention.

Now with an 18-bit accumulator one can consider $\Delta$ to be any (integer) value between $\Delta_H$=13496 and $\Delta_L$=13487. Then the nominal frequency of Q4 will be between +320.4 ppm and −347 ppm. In contrast with the earlier situation of just two choices, "low" or "high", one can now provide 10 choices in the same range and thus one can expect to get a much improved granularity which in turn translates to much reduced jitter in the recovered clock signal. A simple control mechanism to adjust $\Delta$ is depicted in FIG. 6.

The phase detection scheme is as before and detects whether the rising edge of Q4 is early or late. This controls a multiplexer 330 ("MUX") that selects an increment of +1 or −1 to be added to the current value of $\Delta$. The adder 340 includes circuitry to ensure that the range of outputs is kept to between $\Delta_H$ and $\Delta_L$. The "$\Delta$ REGISTER" 350 is most advantageously clocked by T1-SIG since if there is no pulse in T1-SIG the phase detector cannot make a determination of early/late and the current value for $\Delta$ is "held".

Thus, the rate of change of the output phase can be increased or decreased. This acceleration or deceleration, as the case may be, can be made available for either advancing or retarding the output phase relative to the incoming signal. When the register 350 is saturated (i.e., either $\Delta_H$ and $\Delta_L$ as the case may be) the rate of change can only be held constant or decreased.

The frequency of the incoming T1 signal relative to the local oscillator can be determined by observing the "increment" $\Delta$. Denote by <$\Delta$> the average value of $\Delta$ taken over a reasonable length of time. Then the average frequency of the incoming T1 signal in terms of the local oscillator frequency is given by $$F_{T1} \cong f_0 \frac{\langle \Delta \rangle}{2^N}$$

The precision of this average is much better than the case where one used just two selections for the instantaneous frequency of Q4. Furthermore, because of the finer granularity of choices for the instantaneous frequency of Q4, the overall jitter performance is vastly improved.

While not being limited to any particular performance indicator or diagnostic identifier, preferred embodiments of the invention can be identified one at a time by testing for the presence of accurate rapid phase shift detection. The test for the presence of accurate rapid phase shift detection can be carried out without undue experimentation by the use of a simple and conventional bench top experiment where SIG-T1 is rapidly shifted in a controlled manner and the response of the system is evaluated.

The invention can also be included in a kit. The kit can include some, or all, of the components that compose the invention. The kit can be an in-the-field retrofit kit to improve existing systems that are capable of incorporating the invention. The kit can include software/firmware and/or hardware for carrying out the invention. The kit can also contain instructions for practicing the invention. The components, software, firmware, hardware and/or instructions of the kit can be the same as those used in the invention.

The term approximately, as used herein, is defined as at least close to a given value (e.g., preferably within 10% of, more preferably within 1% of, and most preferably within 0.1% of). The term coupled, as used herein, is defined as connected, although not necessarily directly, and not necessarily mechanically. The term deploying, as used herein, is defined as designing, building, shipping, installing and/or operating. The term means, as used herein, is defined as hardware, firmware and/or software for achieving a result. The term program or phrase computer program, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system. The terms including and/or having, as used herein, are defined as comprising (i.e., open to additional elements). The terms a or an, as used herein, are defined as one or more than one. The term another, as used herein, is defined as at least a second or more.

All the disclosed embodiments of the invention disclosed herein can be made and used without undue experimentation in light of the disclosure. Although the best mode of carrying out the invention contemplated by the inventor is disclosed, practice of the invention is not limited thereto. Accordingly, it will be appreciated by those skilled in the art that the invention may be practiced otherwise than as specifically described herein.

Variation may be made in the steps or in the sequence of steps composing methods described herein. Further, although the invention described herein can be a separate module, it will be manifest that the invention may be integrated into the system with which it is (they are) associated. Furthermore, all the disclosed elements and features of each disclosed embodiment can be combined with, or substituted for, the disclosed elements and features of every other disclosed embodiment except where such elements or features are mutually exclusive.

It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

What is claimed is:

1. A method, comprising:
   incrementing a high counter once every clock cycle when a state variable indicator is high;
   clearing a low counter when the state variable indicator is high;
   incrementing the low counter once every clock cycle when the state variable indicator is low;
   clearing the high counter when the state variable indicator is low; and
   triggering an alarm signal when either
      i) the low counter exceeds a low count threshold or
      ii) the high counter exceeds a high count threshold.

2. The method of claim 1, wherein the state variable indicator is a binary modulo indicator DWN+/UP.

3. The method of claim 1, further comprising, when the alarm signal is triggered, temporarily disabling a local oscillator discipline arrangement.

4. The method of claim 1, further comprising:
   setting the state variable indicator to either
      i) a high value when an output phase of a numerically controlled oscillator lags an incoming signal phase, or
      ii) a low value when the output phase leads the incoming signal phase; then
   sending either
      i) a high increment to the numerically controlled oscillator when the state variable indicator has been set to the high value, or
      ii) a low increment to the numerically controlled oscillator when the state variable indicator has been set to the low value; and then either
         i) advancing the output phase when the high increment has been sent to the numerically controlled oscillator, or
         ii) retarding the output phase when the low increment has been sent to the numerically controlled oscillator.

5. A computer program, comprising computer or machine readable program elements translatable for implementing the method of claim 1.

6. An apparatus for performing the method of claim 1.

7. A method of detection of a rapid change in an incoming T1 signal, comprising the method of claim 1.

8. An apparatus, comprising:
   a source of a clock signal;
   a source of a state variable indicator;
   a high counter coupled to the source of the clock signal and the source of a state variable indicator, the high counter incremented once every clock cycle when the state variable indicator is high;
   a low counter coupled to the source of the clock signal and the source of the state variable indicator, the low counter incremented once every clock cycle when the state variable indicator is low; and
   an alarm coupled to the high counter and the low counter, the alarm triggered when either
      i) the low counter exceeds a low count threshold or
      ii) the high counter exceeds a high count threshold,
   wherein the high counter is cleared when the state variable indicator is low, and the low counter is cleared when the state variable indicator is high.

9. The apparatus of claim 8, wherein said source of a clock signal is an incoming clock signal SIG-T1.

10. The apparatus of claim 8, further comprising a local oscillator discipline arrangement coupled to the alarm.

11. A method of detecting a rapid change in an incoming T1 signal, comprising deploying the apparatus of claim 8.

12. An integrated circuit, comprising the apparatus of claim 8.

13. A circuit board, comprising the integrated circuit of claim 12.

14. A computer, comprising the circuit board of claim 13.

15. A network, comprising the computer of claim 14.

16. A kit, comprising:
   a source of a clock signal;
   a source of a state variable indicator;
   a high counter coupled to the source of the clock signal and the source of a state variable indicator, the high counter incremented once every clock cycle when the state variable indicator is high;
   a low counter coupled to the source of the clock signal and the source of the state variable indicator, the low counter incremented once every clock cycle when the state variable indicator is low; and
   an alarm coupled to the high counter and the low counter, the alarm triggered when either
      i) the low counter exceeds a low count threshold or
      ii) the high counter exceeds a high count threshold,
   wherein the high counter is cleared when the state variable indicator is low, and the low counter is cleared when the state variable indicator is high.

* * * * *